US008766268B2

(12) United States Patent
Yoon et al.

(10) Patent No.: US 8,766,268 B2
(45) Date of Patent: Jul. 1, 2014

(54) THIN FILM TRANSISTOR ARRAY PANEL

(71) Applicant: Samsung Display Co., Ltd., Yongin (KR)

(72) Inventors: Yeo-Geon Yoon, Seoul (KR); Hyoung-Wook Lee, Asan-si (KR); Mi-Ae Lee, Cheonan-si (KR); Ho-Jun Lee, Anyang-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/957,264

(22) Filed: Aug. 1, 2013

(65) Prior Publication Data

US 2013/0313559 A1 Nov. 28, 2013

Related U.S. Application Data

(62) Division of application No. 12/785,969, filed on May 24, 2010, now Pat. No. 8,525,180.

(30) Foreign Application Priority Data

Oct. 16, 2009 (KR) ........................ 10-2009-0098920

(51) Int. Cl.
H01L 27/088 (2006.01)
H01L 29/786 (2006.01)
(52) U.S. Cl.
USPC .... 257/59; 257/72; 257/E27.06; 257/E29.273
(58) Field of Classification Search
None
See application file for complete search history.

(56) References Cited

U.S. PATENT DOCUMENTS

| | | | |
|---|---|---|---|
| 5,453,857 A * | 9/1995 | Takahara | 349/48 |
| 6,707,441 B1 * | 3/2004 | Hebiguchi et al. | 345/92 |
| 6,822,718 B2 | 11/2004 | Choi et al. | |
| 6,850,290 B1 | 2/2005 | Song | |
| 6,882,375 B2 | 4/2005 | Kim | |
| 6,969,872 B2 | 11/2005 | Kim | |
| 6,995,394 B2 | 2/2006 | Hong et al. | |
| 7,176,988 B2 | 2/2007 | Song | |
| 7,199,775 B2 | 4/2007 | Igarashi et al. | |
| 8,106,399 B2 * | 1/2012 | Park | 257/71 |

(Continued)

FOREIGN PATENT DOCUMENTS

| | | |
|---|---|---|
| JP | 10-090712 | 4/1998 |
| JP | 2001-296553 | 10/2001 |
| KR | 10-2006-0028970 | 4/2006 |
| KR | 10-2008-0030799 | 4/2008 |

*Primary Examiner* — Thomas L Dickey
*Assistant Examiner* — Joseph Schoenholtz
(74) *Attorney, Agent, or Firm* — Innovation Counsel LLP

(57) ABSTRACT

A thin film transistor (TFT) array panel includes: first and second pixel electrodes neighboring each other; a data line extending between the first and the second pixel electrodes; first and second gate lines extending perpendicularly to the data line; a first TFT including a first gate electrode connected to the first gate line, a first source electrode connected to the data line, and a first drain electrode facing the first source electrode and connected to the first pixel electrode; and a second TFT including a second gate electrode connected to the second gate line, a second source electrode connected to the data line, and a second drain electrode facing the second source electrode and connected to the second pixel electrode. The first source electrode has the same relative position with respect to the first drain electrode as the second source electrode with respect to the second drain electrode.

17 Claims, 7 Drawing Sheets

(56) References Cited

U.S. PATENT DOCUMENTS

| | | | |
|---|---|---|---|
| 8,233,122 B2* | 7/2012 | Lee et al. | 349/139 |
| 8,593,440 B2* | 11/2013 | Bae et al. | 345/205 |
| 2001/0012076 A1 | 8/2001 | Ohkawara et al. | |
| 2001/0046002 A1 | 11/2001 | Lin et al. | |
| 2003/0197815 A1 | 10/2003 | Choi et al. | |
| 2004/0125262 A1 | 7/2004 | Cho et al. | |
| 2007/0216632 A1* | 9/2007 | Lee | 345/100 |
| 2009/0004787 A1* | 1/2009 | Kim | 438/160 |
| 2009/0015746 A1 | 1/2009 | Te-Chen et al. | |
| 2009/0130789 A1* | 5/2009 | Park et al. | 438/34 |
| 2010/0155735 A1* | 6/2010 | Park | 257/71 |

* cited by examiner

THIN FILM TRANSISTOR ARRAY PANEL

CROSS-REFERENCE TO RELATED APPLICATION

This application is a divisional application of U.S. patent application Ser. No. 12/785,969 filed in the United States Patent and Trademark Office on May 24, 2010, which claims priority to and the benefit of Korean Patent Application No. 10-2009-0098920 filed in the Korean Intellectual Property Office on Oct. 16, 2009, the entire content of which is incorporated herein by reference.

BACKGROUND OF THE INVENTION (a) Field of the Invention

The present invention relates to a thin film transistor array panel.

(b) Description of the Related Art

Recently, flat panel display devices have gained popularity in the market, and their sales are growing quickly. One of the appealing characteristics of a flat panel display is its thinness. Liquid crystal displays (LCDs) and organic light emitting devices (OLEDs) are among some of the widely used flat panel displays.

A display device typically includes a display panel having pixels arranged in a matrix. Each pixel includes a pixel electrode, a common electrode, and a thin film transistor as a switching element connected to the pixel electrode. The thin film transistor is connected to a gate line transmitting a gate signal generated by the gate driver and a data line transmitting a data signal generated by a data driver, and the thin film transistor controls the data signal transmitted to the pixel electrode according to the gate signal. Each pixel of the display device represents one of primary colors such as red, green, and blue, and a color filter or an emission layer emitting a unique color is positioned at the region corresponding to each pixel.

The liquid crystal display applies the voltages to the pixel electrode and the common electrode to generate an electric field to the liquid crystal layer, and in order to prevent image deterioration due to long-time application of a unidirectional electric field, etc., polarity of the data voltages with respect to the common voltage is reversed every frame, every row, or every pixel.

The gate driver and the data driver of the display device generally include a plurality of driver ICs, and the cost of the data driver ICs is higher than that of the gate driving circuit chips. Hence, many designs require a smaller number of data driver ICs for cost-effectiveness. When reducing the number of data driving ICs, however, uniformity gets compromised in the structure and position of the thin film transistors, sometimes causing deteriorations such as vertical lines to be displayed under inversion driving.

The above information disclosed in this Background section is only for enhancement of understanding of the background of the invention and therefore it may contain information that does not form the prior art that is already known in this country to a person of ordinary skill in the art.

SUMMARY OF THE INVENTION

A thin film transistor array panel according to an exemplary embodiment of the present invention includes: a first pixel electrode and a second pixel electrode neighboring each other in a second direction; a data line extending in a first direction, transmitting a data voltage, and disposed between the first pixel electrode and the second pixel electrode; a first gate line and a second gate line extending in the second direction and neighboring each other; a first thin film transistor including a first gate electrode connected to the first gate line, a first source electrode connected to the data line, and a first drain electrode facing the first source electrode and connected to the first pixel electrode; and a second thin film transistor including a second gate electrode connected to the second gate line, a second source electrode connected to the data line, and a second drain electrode facing the second source electrode and connected to the second pixel electrode, wherein a relative position of the first source electrode with respect to the first drain electrode is the same as a relative position of the second source electrode with respect to the second drain electrode.

The first source electrode may be connected to the data line through a first source connection, and the second source electrode may be connected to the data line through a second source connection, and the first source connection may be longer than the second source connection.

The first thin film transistor may be disposed on the other side of the data line from the second thin film transistor.

The first source electrode may be disposed at a right side of the first drain electrode, and the second source electrode may be disposed at a right side of the second drain electrode.

The first thin film transistor may be disposed on the other side of the data line from the second thin film transistor.

The first source electrode may be disposed at a left side of the first drain electrode, and the second source electrode may be disposed at a right side of the second drain electrode with respect to the first direction.

The first pixel electrode may cover the first gate line in the first direction, and the second pixel electrode may cover the second gate line in the first direction.

The first pixel electrode may not cover the second gate line, and the second pixel electrode may not cover the first gate line.

A third gate line neighboring the first gate line and receiving a gate-on voltage before the first gate line may be further included, and the first pixel electrode may cover the third gate line in the first direction.

The first gate line may be supplied with a gate-on voltage before the second gate line, and the second pixel electrode may cover the first gate line in the first direction.

A thin film transistor array panel according to an exemplary embodiment of the present invention includes: a plurality of pixel electrodes arranged in a matrix; a plurality of data lines extending in a first direction such that one data line is disposed per two pixel electrode columns; and a plurality of gate lines extending in a second direction and disposed in pairs per one pixel electrode row. First and second pixel electrodes neighbor each other in the second direction with the first data line interposed therebetween, first and second gate lines disposed at a first pixel electrode row where the first pixel electrode and the second pixel electrode are disposed, the first pixel electrode is connected to a first thin film transistor including a first source electrode connected to the first data line, a first drain electrode facing the first source electrode, and a first gate electrode, the second pixel electrode is connected to a second thin film transistor including a second source electrode connected to the first data line, the second drain electrode facing the second source electrode, and a second gate electrode, and a relative position of the first source electrode with respect to the first drain electrode is the same as a relative position of the second source electrode with respect to the second drain electrode.

The first gate electrode and the second gate electrode may be respectively connected to a different one of one of the first gate line and the second gate line.

The first source electrode may be connected to the data line through a first source connection, the second source electrode may be connected to the data line through a second source connection, and the first source connection may be longer than the second source connection.

A thin film transistor array panel according to another exemplary embodiment of the present invention includes: a first gate line and a second gate line extending in a second direction and neighboring each other; a data line extending in a first direction; and a pixel electrode connected to the first gate line and the data line through a thin film transistor thereby receiving a data voltage, wherein the pixel electrode covers the first gate line in the first direction and does not cover the second gate line.

A thin film transistor array panel according to another exemplary embodiment of the present invention includes: a first gate line and a second gate line extending in a second direction and neighboring each other; a data line extending in a first direction; and a pixel electrode connected to the first gate line and the data line through a thin film transistor thereby receiving a data voltage, wherein the second gate line is applied with a gate-on voltage before the first gate line and is disposed in a previous row of the first gate line, and the pixel electrode covers the second gate line in the first direction.

The pixel electrode may cover the first gate line in the first direction.

A thin film transistor array panel according to another exemplary embodiment of the present invention includes: a plurality of pixel electrodes arranged in a matrix; a plurality of gate lines extending in a second direction, wherein a pair of gate lines is disposed for one pixel electrode row; and a plurality of data lines extending in a first direction such that one of the data lines is disposed for two pixel electrode columns, wherein two gate lines disposed at each pixel electrode row include the first gate line and the second gate line neighboring each other, each pixel electrode row includes a first pixel electrode connected to the first gate line and a second pixel electrode connected to the second gate line, the first pixel electrode covers the first gate line in the first direction and does not cover the second gate line, and the second pixel electrode covers the second gate line in the first direction and does not cover the first gate line.

The first pixel electrode of one pixel electrode row may cover the second gate line of a previous pixel electrode row in the first direction.

The first gate line connected to the first pixel electrode of one pixel electrode row may be applied with a gate-on voltage later than the second gate line of the previous pixel electrode row.

The second pixel electrode of one pixel electrode row may cover the first gate line of the corresponding pixel electrode row in the first direction.

Figure 1:
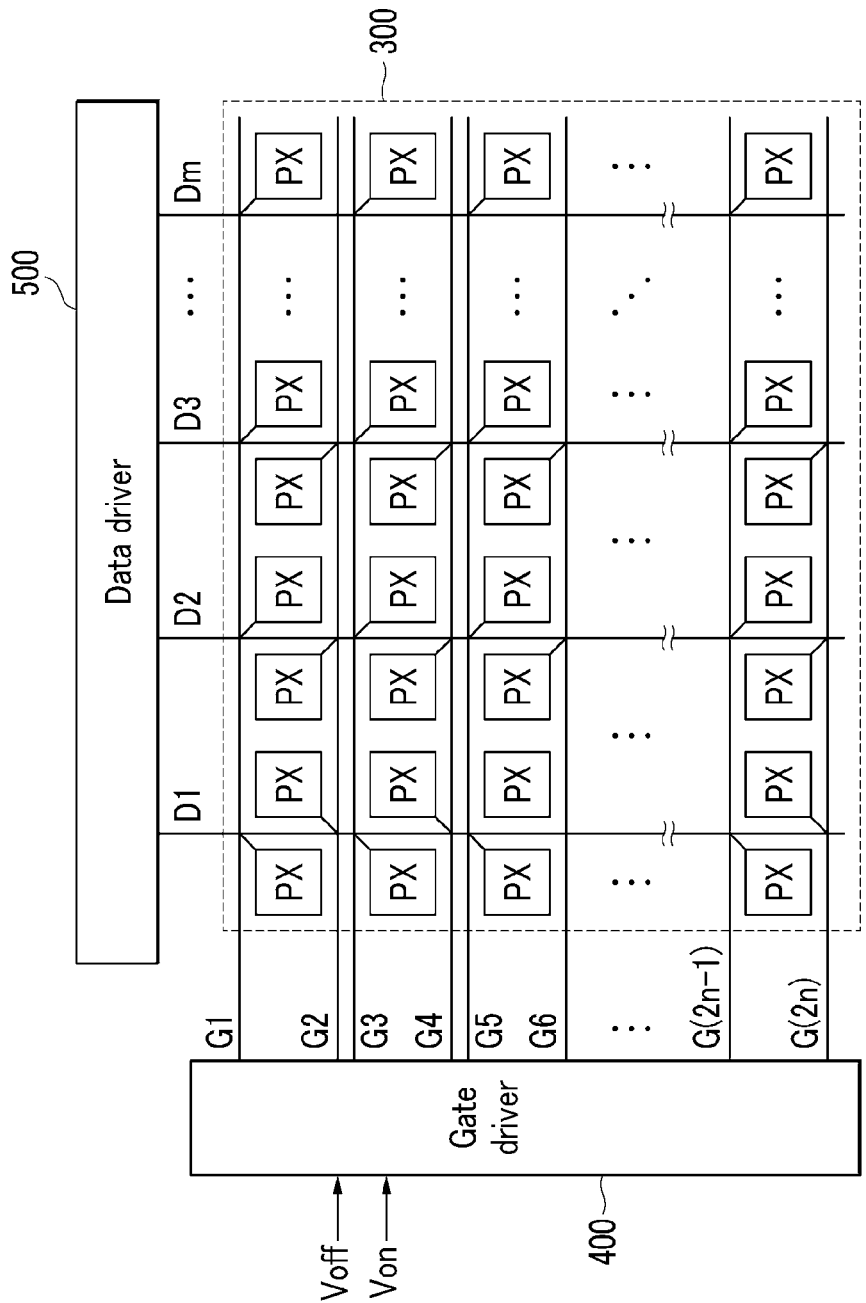
FIG. 1 is a block diagram of a display device including a thin film transistor array panel according to an exemplary embodiment of the present invention.

| Description of Reference Numerals Indicating Primary Elements in the Drawings | |
|---|---|
| 3: liquid crystal layer | 100: thin film transistor array panel |
| 200: common electrode panel | 110, 210: substrate |
| 121a, 121b: gate line | 124a, 124b: gate electrode |
| 140: gate insulating layer | 151, 152, 154, 154a, 154b: semiconductor |
| 163, 165: ohmic contact | 171: data line |
| 173a, 173b, 173c, 173d: source electrode | |
| 175: drain electrode | 180: passivation layer |
| 185: contact hole | 191, 191a, 191b: pixel electrode |
| 220: light blocking member | 230: color filter |
| 250: overcoat | 270: common electrode |
| 300: display panel assembly | 400: gate driver |
| 500: data driver | PX, R, G, B: pixel |

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may be present. In contrast, when an element is referred to as being "directly on" another element, there are no intervening elements present. As used herein, one gate line and another gate line "neighboring" each other is intended to mean that there is no other gate line between the two gate lines. Similarly, two pixel electrodes "neighboring" each other is intended to mean that there is no other pixel electrode between those two electrodes, and two data lines "neighboring" each other is intended to mean that there is no third data line between those two data lines. A pixel row neighboring another pixel row means there is no third pixel row between the two pixel rows.

Now, a thin film transistor array panel and a display device including the same according to an exemplary embodiment of the present invention will be described with reference to drawings.

Figure 2:
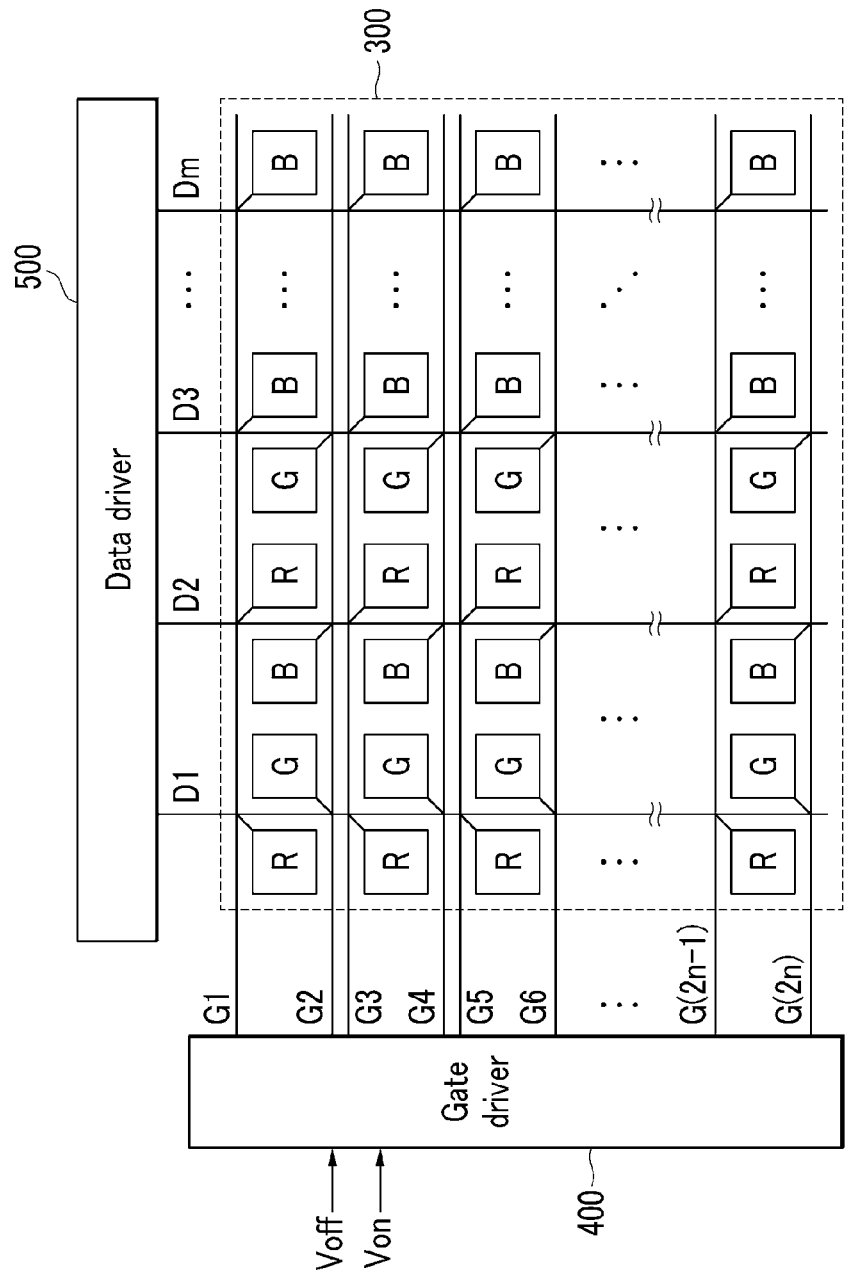
FIG. 2 is a block diagram of a display device including a thin film transistor array panel according to an exemplary embodiment of the present invention.

FIG. 1 and FIG. 2 are block diagrams of a display device including a thin film transistor array panel according to an exemplary embodiment of the present invention.

Referring to FIG. 1 and FIG. 2, a display device according to an exemplary embodiment of the present invention includes a display panel assembly 300, and a gate driver 400 and a data driver 500 connected thereto.

The display panel assembly 300 includes a plurality of signal lines G1-G2n and D1-Dm, and a plurality of R, G, and B pixels (PX) arranged in an approximate matrix.

For color display, each pixel R, G, and B (PX) uniquely displays one of three primary colors, and a desired color is recognized by a spatial or temporal sum of the primary colors. For example, the primary colors may be red, green, and blue.

The display signal lines G1-G(2n) and D1-Dm include a plurality of gate lines G1 to G(2n) for transmitting gate signals (also referred to as "scanning signals") and a plurality of data lines D1 to Dm for transmitting data voltages. The gate lines G1 to G(2n) are arranged in parallel with each other and extend approximately in a second direction, and the data lines D1 to Dm are arranged in parallel with each other and extend approximately in a first direction. The display signal lines G1-G(2n) and D1-Dm may be formed on a thin film transistor array panel included in the display panel assembly 300.

Each pixel R, G, B, PX includes a pixel electrode (not shown) receiving a data signal through a switching element (not shown) such as the thin film transistor connected to the gate lines G1-G(2n) and the data lines D1-Dm, and a common electrode (not shown) facing the pixel electrode and receiving a common voltage Vcom.

A pair of gate lines $G_1$ and $G_2$, $G_3$ and $G_4$, ..., $G(2n-1)$ and $G(2n)$ are respectively disposed above and below each row of pixels such that the pixels R, G, B, PX of one pixel row are connected to one of the pair of gate lines G1 and G2, G3 and G4, ..., G(2n-1) and G(2n) that neighbor the pixel row.

As for the data lines, there is one data line Di for a pair of pixel columns. A data line Di is one of the data lines D1-Dm. In more detail, a data line Di extends between a pair of pixel columns such that the pixels R, G, B, PX of the odd-numbered pixel columns are connected to the data lines that are to the right side of the pixel columns, and the pixels R, G, B, PX of the even-numbered pixel columns are connected to the data lines that are to the left side of the pixel columns. The pixels connect to the data lines through switching elements.

The gate driver 400 is connected to the gate lines G1-G(2n) of the display panel assembly 300 to apply a gate signal. A gate signal is a combination of a gate-on voltage Von for turning on the switching element and a gate-off voltage Voff for turning off the switching element to the gate lines G1-G(2n).

The data driver 500 is connected to the data lines D1-Dm of the display panel assembly 300, and applies the data voltage to the data lines D1-Dm.

Referring to FIG. 2, the red pixel R column representing red, the green pixel G column representing green, and the blue pixel B column representing blue are alternately arranged in the second direction.

The red pixels R are all connected to the odd-numbered gate lines G1, G3, ..., G(2n-1), and the red pixels R that are connected to neighboring data lines are connected to the respective data lines D1-Dm disposed at different sides of the pixels. For example, the red pixel R connected to the first data line D1 is connected to the data line D1 disposed to its right side, and the red pixel R connected to the second data line D2 is connected to the data line D2 disposed to its left side.

Meanwhile, the green pixels G are connected to the even-numbered gate lines G2, G4, ..., G(2n), which in this embodiment is the higher-numbered gate line between the two neighboring gate lines. Further, the green pixels G that neighbor each other in the second direction are connected to the data lines D1-Dm disposed at different sides from each other.

In the case of the blue pixels B, the blue pixels B of each pixel row are alternately connected to the gate lines G1-G(2n) disposed above and below the row, and the blue pixels B neighboring in the second direction are connected to the data lines D1-Dm disposed at different sides.

The pixels R, G, B, PX disposed in the same pixel column may be connected to the gate lines G1-G(2n) and the data lines D1-Dm in substantially the same manner.

The connection of the pixels R, G, and B (PX) and the display signal lines G1-G2n and D1-Dm shown in FIG. 2 is only an example, and the connection and arrangement of the pixels may be changed.

Next, a display panel assembly according to an exemplary embodiment of the present invention will be described with reference to FIG. 3 to FIG. 5.

Figure 3:
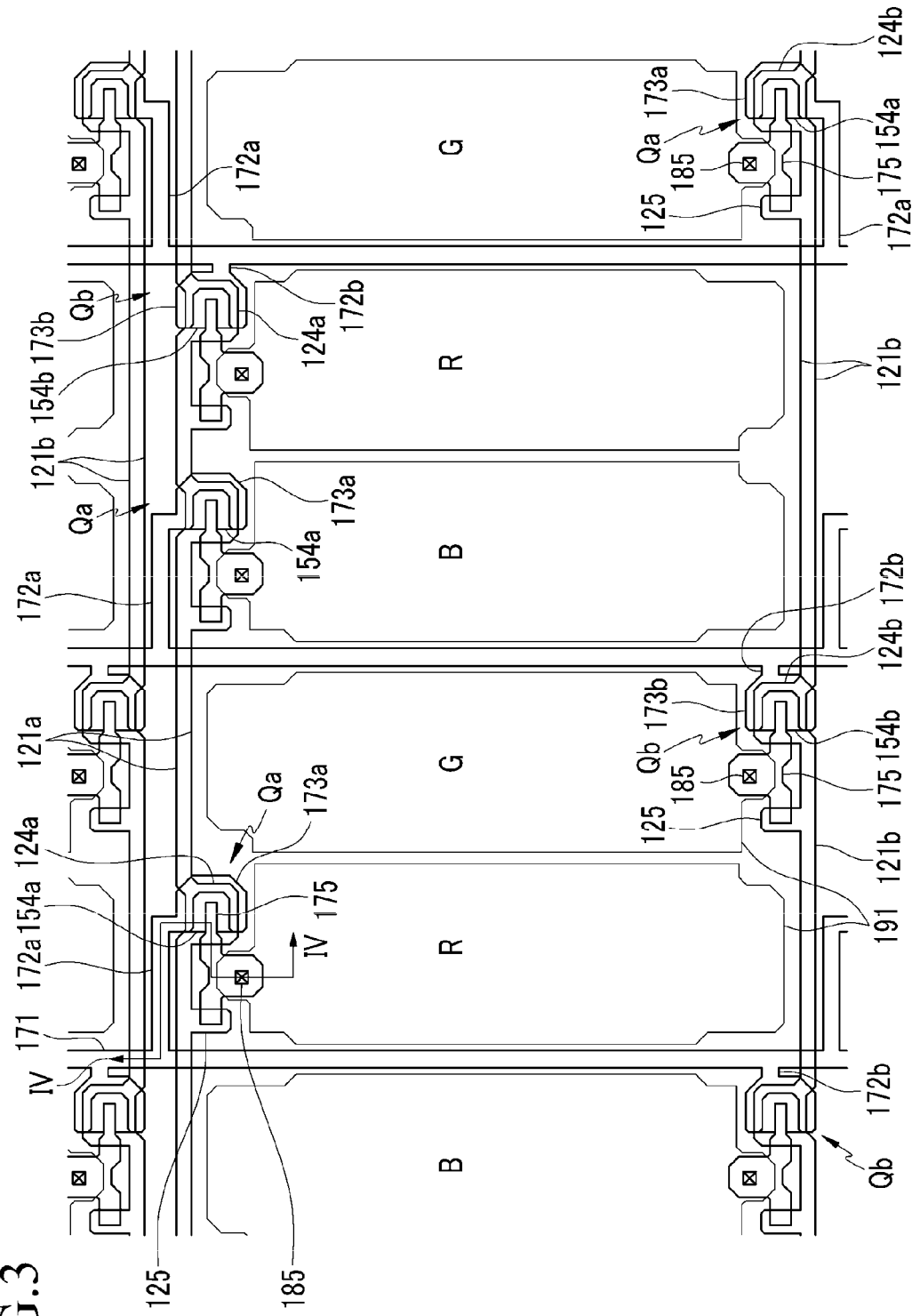
FIG. 3 is a layout view of a display panel assembly according to an exemplary embodiment of the present invention.
Figure 4:
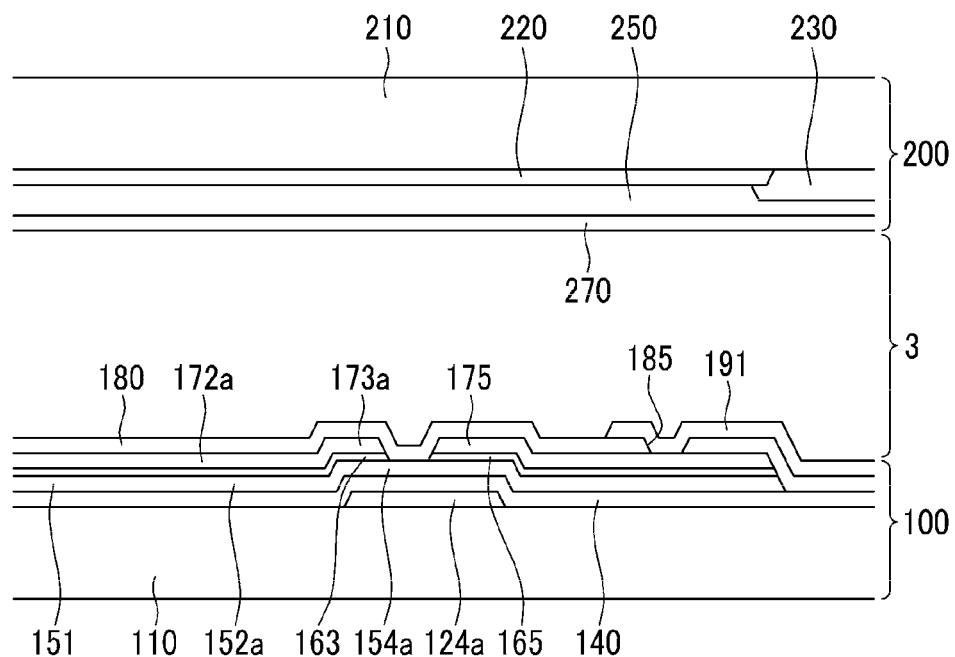
FIG. 4 is a cross-sectional view of the display panel assembly shown in FIG. 3 taken along the line IV-IV.
Figure 5:
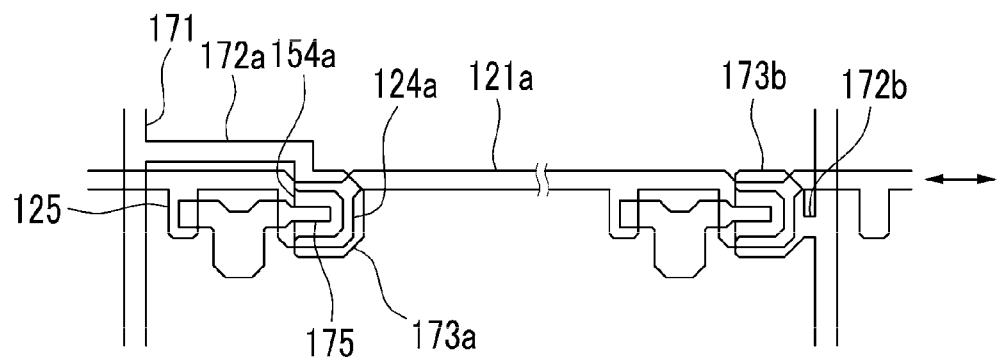
FIG. 5 is a layout view showing a portion of the display panel assembly shown in FIG. 3, and FIG. 6, FIG. 7, and FIG. 8 are layout views of a thin film transistor array panel according to another exemplary embodiment of the present invention, respectively.

FIG. 3 is a layout view of a display panel assembly according to an exemplary embodiment of the present invention, FIG. 4 is a cross-sectional view of the display panel assembly shown in FIG. 3 taken along the line IV-IV, and FIG. 5 is a layout view showing a portion of the display panel assembly shown in FIG. 3.

A display panel assembly of the display device according to the present exemplary embodiment as a liquid crystal panel assembly includes a thin film transistor array panel 100 and a common electrode panel 200 facing each other, and a liquid crystal layer 3 interposed between the two panels 100 and 200.

Referring to the common electrode panel 200, a light blocking member 220 and a plurality of color filters 230 are formed on an insulation substrate 210. Each color filter 230 may represent one of a few primary colors (e.g., red, green, and blue). At least one of the color filter 230 and the light blocking member 220 may be formed in the thin film transistor array panel 100.

An overcoat 250 is formed on the color filter 230 and the light blocking member 220, and a common electrode 270 receiving a common voltage Vcom is formed on the overcoat 250.

Next, referring to the thin film transistor array panel 100, a plurality of gate conductors including a plurality of first gate lines 121a and second gate lines 121b are formed on an insulation substrate 110.

The first gate line 121a and the second gate lines 121b transmit gate signals, extend in the second direction, and are alternately disposed along the first direction. Referring to FIG. 2 and FIG. 3, the first gate line 121a (which may correspond to gate line G3 of FIG. 2) and the second gate line 121b (which may correspond to gate line G4 of FIG. 2) form a pair, and the first gate line 121a (G3) is closer to the second gate line 121b of a different pair (e.g., gate line G2 of FIG. 2) than the second gate line 121b (G4) that is its pair.

The first gate lines 121a include a plurality of first gate electrodes 124a and a plurality of assistance gate electrodes 125 protruding toward the second gate lines 121b that are in the respective pairs. The assistance gate electrodes 125 are disposed near the left side of the first gate electrodes 124a, as shown in FIG. 3; however, they may be disposed at the right side of the first gate electrodes 124a in some embodiments.

The second gate lines 121b include a plurality of second gate electrodes 124b and a plurality of assistance gate electrodes 125 protruding toward the first gate lines 121a that are in the respective pairs. The assistance gate electrodes 125 are disposed near the left side of the second gate electrodes 124b, as shown in FIG. 3; however, they may be disposed at the right side of the second gate electrodes 124b in some embodiments.

A gate insulating layer 140 made of silicon nitride (SiNx) or silicon oxide (SiOx) is formed on the first and second gate lines 121a and 121b, and a plurality of semiconductor stripes 151 that are made of hydrogenated amorphous silicon (abbreviated as a-Si) or polysilicon are formed on the gate insulating layer 140.

The semiconductor stripe 151 extends in the first direction, and includes a plurality of first semiconductor connections 152a protruding to the right side ("right side" with respect to FIG. 3) from the portions that extend mainly in the first direction toward the first gate electrode 124a or the second gate electrode 124b. The plurality of first semiconductors 154a are connected to the ends of the first semiconductor connections 152a and overlap at least a portion of the first gate electrode 124a or the second gate electrode 124b. Also, the semiconductor stripes 151 include a plurality of second semiconductor connections (not shown) protruding to the left side (with respect to FIG. 3) from the portions that extend mainly in the first direction toward the first gate electrode 124a or the second gate electrode 124b. The plurality of second semiconductors 154b are connected to the ends of the second semiconductor connections and overlap at least a portion of the first gate electrode 124a or the second gate electrode 124b. The first semiconductor connections 152a are longer than the second semiconductor connections 152b, extend along the space between the first gate line 121a and the second gate line 121b that is closest to the first gate line 121a, and extend substantially parallel to the first and second gate lines 121a and 121b.

A plurality of ohmic contacts 163 and 165 are formed on the semiconductor stripes 151. The ohmic contact 163 and the ohmic contact 165 are disposed across the first and second gate electrodes 124a and 124b from each other, and are arranged as a pair on the first and second semiconductors 154a and 154b.

A data conductor including a plurality of data lines 171 and a plurality of drain electrodes 175 is formed on the ohmic contacts 163 and 165 and the gate insulating layer 140.

The data lines 171 transmit the data signal and extend in the first direction, thereby intersecting the first and second gate lines 121a and 121b. Each data line 171 includes a plurality of first source connections 172a protruding to the right side from the portions that extend mainly in the first direction toward a neighboring first gate electrode 124a or the second gate electrode 124b without overlapping the first gate electrode 124a and the second gate electrode 124b. The data line 171 also has a plurality of first source electrodes 173a connected to the ends of the first source connections 172a and overlapping at least portions of the first gate electrode 124a or the second gate electrode 124b, a plurality of second source connections 172b extending to the left side toward the first gate electrode 124a or the second gate electrodes 124b, and a plurality of second source electrodes 173b connected to the ends of the second source connections 172b.

That is, the first source connection 172a extends to the right side of each data line 171, the first source electrode 173a connected to the first source connection 172a may overlap the first gate electrode 124a of the first gate line 121a (in FIG. 3, the case of the left red pixel R and the right blue pixel B), or may overlap the second gate electrode 124b of the second gate line 124b (in FIG. 3, the case of the right green pixel G). On the other hand, the second source connection 172b extends to the left side of the data line 171, and the second source electrode 173b connected thereto may also overlap the first gate electrode 124a of the first gate line 121a (in FIG. 3, the case of the right red pixel R) or the second gate electrode 124b of the second gate line 124b (in FIG. 3, the case of the left blue pixel B and the left green pixel G).

The first source connection 172a is longer than the second source connection 172b, extends along the space between the first gate line 121a and the closest second gate line 121b, and extends substantially parallel to the first and second gate lines 121a and 121b.

As shown in FIG. 3, the first source connection 172a, the semiconductor connection 152 (see FIG. 4), and ohmic contacts (not shown) therebetween extend according to the closest first gate line 121a and the closest second gate line 121b, and may not overlap the first and second gate lines 121a and 121b.

The drain electrode 175 includes a first bar end facing the first source electrode 173a or the second source electrode 173b with respect to the first gate electrode 124a or the second gate electrode 124b and enclosed by the curved first source electrode 173a or the curved second source electrode 173b. The drain electrode 175 also includes a second end partially overlapping the assistance gate electrode 125 and an expansion protruding between the two bar ends. The second bar end of the drain electrode 175 overlapping the assistance gate electrode 125 and the assistance gate electrode 125 cause parasitic capacitance to be generated between the first and second gate lines 121a and 121b including the first and second gate electrodes 124a and 124b, and the drain electrode 175 uniform in the pixels, and may be omitted to improve the aperture ratio in an exemplary embodiment of the present invention.

The first gate electrode 124a or the second gate electrode 124b, the first source electrode 173a, and the drain electrode 175 form the first thin film transistor (TFT) Qa along with the first semiconductor 154a, and the first gate electrode 124a or the second gate electrode 124b, the second source electrode 173b, and the drain electrode 175 form the second thin film transistor Qb along with the second semiconductor 154b. The first thin film transistor Qa is disposed at the right side with respect to the data line 171, and the second thin film transistor Qb is disposed at the left side of the data line 171. The channel of the first and second thin film transistors Qa and Qb is formed in the first and second semiconductors 154a and 154b between the first and second source electrodes 173a and 173b and the drain electrode 175.

In an exemplary embodiment of the present invention, the first thin film transistor Qa at the right side of the neighboring data line 171 may be disposed at the right side of the drain electrode 175 facing the first source electrode 173a through the first source connection 172a, such that it may have the same relative positions as the drain electrode 175 of the second source electrode 173b of the second thin film transistor Qb. In other words, the relative position of the first source electrode 173a with respect to the drain electrode 175 in the first thin film transistor Qa is the same as the position relationship of the second source electrode 173b with respect to the drain electrode 175 in the second thin film transistor Qb in this embodiment, such that the structural shapes of the first and second thin film transistors Qa and Qb are substantially the same.

The gate conductors 121a and 121b and the data conductors 171 and 175 of an exemplary embodiment of the present invention may be formed by depositing a corresponding conductive material on the substrate 110 and patterning it by photolithography. The semiconductor stripes 151 and ohmic contact 163 and 165 may be formed in the same step as the data conductor 171 and 175 through the photolithography process using the same photomask as that for the data conductors 171 and 175.

However, the gate conductors 121a and 121b and the data conductors 171 and 175 are formed through different processes such that an alignment error may be generated between the gate conductors 121a and 121b and the data conductors 171 and 175 when the photomask for exposing the photosensitive film is not aligned at the correct position. Particularly, as shown in FIG. 5, when an alignment error in the second direction indicated by the arrow is generated between the gate conductors 121a and 121b and the data conductors 171 and 175 such that the data conductors 171 and 175 are shifted to the right or left from the present position with respect to the gate conductors 121a and 121b, the size of the overlapping area between the drain electrode 175 and the first gate electrode 124a or second gate electrode 124b is changed.

However, in an exemplary embodiment of the present invention, the drain electrode 175 is equally positioned on the left side of the first source electrode 173a and the second source electrode 173b in all pixels R, G, and B such that the overlapping area between the drain electrode 175 and the first gate electrode 124a or second gate electrode 124b is uniformly reduced when the data conductors 171 and 175 are shifted to the left side with respect to the gate conductors 121a and 121b. Likewise, the overlapping area between the drain electrode 175 and the first gate electrode 124a or second gate electrode 124b is uniformly increased when the data conductors 171 and 175 are shifted to the right side of the gate conductors 121a and 121b. Accordingly, the capacitance of the parasitic capacitor Cgd between the drain electrode 175 and the first gate electrode 124a or second gate electrode 124b is uniformly changed in all pixels R, G, and B.

In the exemplary embodiment shown in FIG. 3 to FIG. 5, the first source electrode 173a of the first thin film transistor Qa disposed at the right side of the neighboring data line 171 is connected to the data line 171 through the first source connection 172a that is longer than the second source connection 172b, and the first and second source electrodes 173a and 173b of the first and second thin film transistors Qa and Qb are all disposed at the right side of the drain electrode 175. However, the second source electrode 173b of the second thin film transistor Qb disposed at the left side with respect to the data line 171 may be connected to the data line 171 through the second source connection 172b having the long length, and the first and second source electrodes 173a and 173b of the first and second thin film transistors Qa and Qb may be positioned at the left side of the drain electrode 175, in reverse. In this case, the capacitance of the parasitic capacitor Cgd between the drain electrode 175 and the first gate electrode 124a or the second gate electrode 124b is also uniformly changed in all pixels R, G, and B (PX).

The ohmic contacts 163 and 165 are interposed only between the underlying semiconductor stripes 151 and the overlying data conductor 171 and the drain electrodes 175 thereon, and reduce contact resistance therebetween. The semiconductor stripes 151 have portions that are exposed without being covered by the data conductors 171 and the drain electrodes 175, as well as portions between the first and second source electrodes 173a and 173b and the drain electrodes 175.

A passivation layer 180 is formed on the data conductors 171 and 175 and the exposed semiconductor 151. The passivation layer 180 has a plurality of contact holes 185 exposing the expansions of the drain electrodes 175.

A plurality of pixel electrodes 191 are formed on the passivation layer 180. The pixel electrodes 191 may be made of a transparent conductive material such as ITO or IZO, or a reflective metal such as aluminum, silver, chromium, or alloys thereof.

The pixel electrodes 191 are physically and electrically connected to the drain electrodes 175 through the contact holes 185, so data voltages are applied to them by the drain electrodes 175. The pixel electrodes 191 supplied with the data voltages generate an electric field along with the common electrode 270 of the common electrode panel 200, which determines the orientations of the liquid crystal molecules of the liquid crystal layer 3 disposed between the electrodes 191 and 270. Accordingly, the polarization of the light transmitted through the liquid crystal layer 3 differs depending on the orientation of the liquid crystal molecules. The pixel electrode 191 and the common electrode 270 form a liquid crystal capacitor and maintain the voltage applied to the pixel electrode after the first and second thin film transistors Qa and Qb are turned off.

As described above, the overlapping areas between the drain electrode 175 and the first and second gate electrodes 124a and 124b are uniformly changed in all pixels R, G, and B even in case of an alignment error. In such cases, a kick-back voltage, which is generated when the data voltage applied to the pixel electrode 191 drops when the first gate line 121a or the second gate line 121b is supplied with the gate-off voltage Voff, is also uniform. Hence, any display deterioration such as blurred vertical lines may be reduced.

In this way, when one data line 171 is disposed every two pixel electrode columns such that the first and second thin film transistors Qa and Qb connected to the data line 171 are positioned at the right and left sides of the data line 171, the position relationship between the source electrodes 173a and 173b and the drain electrode 175 of the first thin film transistor Qa and the second thin film transistor Qb is uniform. This uniformity is achieved through use of the first source connection 172a, reducing the deviation of the kick-back voltage and the vertical line blurs. The method of the invention equally maintains the position relationship of the source electrodes 173a and 173b, and the drain electrode 175 of the first thin film transistor Qa and the second thin film transistor Qb. The invention is not limited by an exemplary embodiment of the present invention.

In the exemplary embodiment shown in FIG. 3 to FIG. 5, the positions of the thin film transistors Qa and Qb in the red pixel R, the green pixel G, and the blue pixel B, that is, the position of the connected gate lines 121a and 121b, are the same as that of FIG. 2. However, the first gate line 121a and the second gate line 121b to which the thin film transistors Qa and Qb are connected may be changed differently from FIG. 3 to FIG. 5 and FIG. 2. For example, the positions along the first direction of the first and second thin film transistors Qa and Qb connected to the right side and the left side of the data line 171 may be uniform for every data line 171 regardless of the kind of the pixels (e.g., R, G, B, or PX).

Next, a thin film transistor array panel according to another exemplary embodiment of the present invention will be described with reference to FIG. 6 and FIG. 7. The same constituent elements as of the previous exemplary embodiment are indicated by the same reference numerals, and the same description is omitted.

Figure 6:
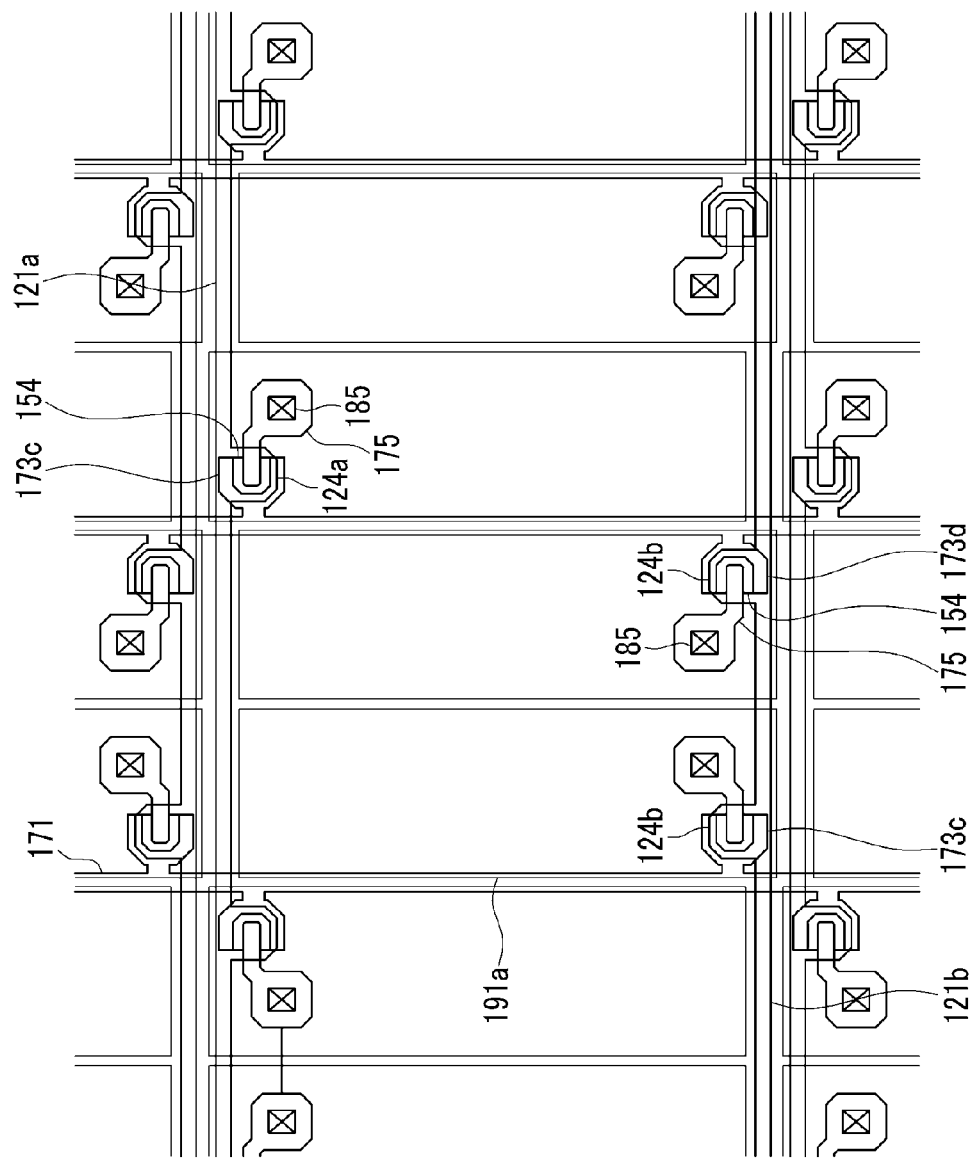
Figure 7:
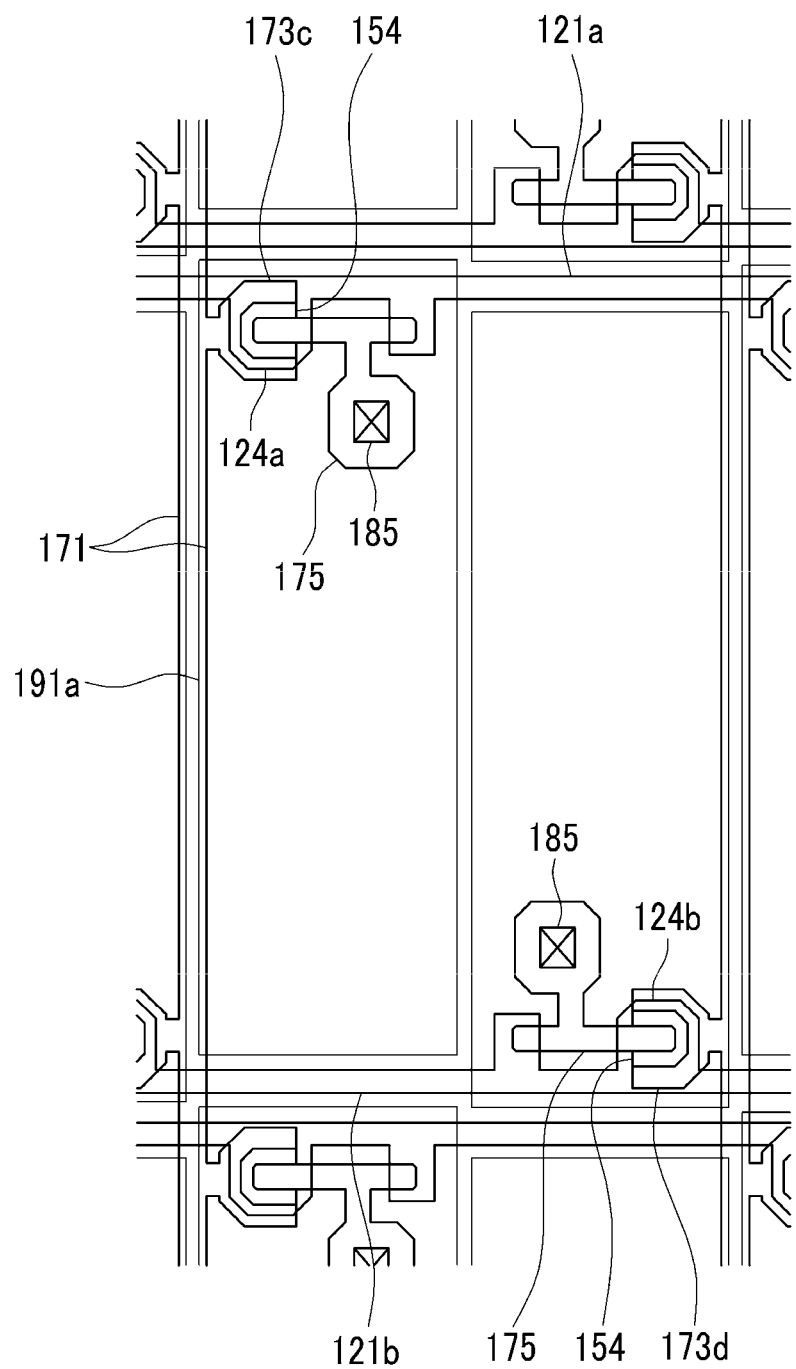

FIG. 6 and FIG. 7 are layout views of a thin film transistor array panel according to another exemplary embodiment of the present invention, respectively. The exemplary embodiment shown in FIG. 6 and FIG. 7 except for the partial shape of constituent elements has almost the same structure and connection relationship.

A plurality of gate conductors including the first gate lines 121 having a plurality of first gate electrodes 124a and the second gate lines 121b having the second gate electrodes 124b are formed on an insulation substrate (not shown), and a gate insulating layer (not shown) is formed thereon. A plurality of semiconductor stripes (not shown) including a plurality of protrusions 154 extending toward the first gate electrode 124a or the second gate electrode 124b are formed on the gate insulating layer 140. A plurality of ohmic contacts (not shown) are formed on the semiconductor stripes, and a plurality of data conductors including a plurality of data lines 171 and a plurality of drain electrodes 175 are formed thereon.

Each data line 171 includes a plurality of first source electrodes 173c extending to the right side toward the first gate electrode 124a or the second gate electrode 124b and a plurality of second source electrodes 173d extending to the left side toward the first gate electrode 124a or the second gate electrode 124b. The first source electrode 173c and the second source electrode 173d are arranged symmetrically with respect to an imaginary line between them, and the position of the first source electrode 173c with respect to the drain electrode 175 facing the first source electrode 173c and the position of the second source electrode 173d with respect to the drain electrode 175 facing the second source electrode 173d are opposite to each other. For example, as shown in FIG. 6, the first source electrode 173c is positioned at the left side of the closest drain electrode 175. However, the second source electrode 173d is positioned at the right side of the closest drain electrode 175.

However, as in the previous exemplary embodiment, in the present exemplary embodiment, the left and right position relationship of the drain electrode 175 for the first source electrode 173c and the second source electrode 173d may be made substantially the same in all pixels through source connections (not shown) having different lengths.

The first gate electrode 124a or the second gate electrode 124b, the first source electrode 173c or the second source electrode 173d, and drain electrode 175 form the thin film transistor along with the protrusion 154 of the semiconductor.

A passivation layer (not shown) having a contact hole 185 is formed on the data conductor 171 and 175 and the exposed protrusion 154 of the semiconductor. The passivation layer 180 may be formed using an inorganic insulator, an organic insulator, or the like, and may have a flat surface. However, the passivation layer 180 may have a dual film structure of a lower inorganic layer and an upper organic layer so that it protects the exposed protrusion 154 of the semiconductor while maintaining the superior insulating characteristic of the organic layer.

A plurality of pixel electrodes 191a are formed on the passivation layer 180. The pixel electrodes 191a are electrically and physically connected to the drain electrode 175 through the contact holes 185, thereby receiving the data voltage.

The pixel electrode 191a, which is connected to the second gate line 121b, extends in the first direction, thereby covering the second gate line 121b in the first direction, as well as the second gate electrode 124b, such that it is close to the first gate line 121a of a different gate-line pair neighboring the second gate line 121b farther away from the data driver 500. The pixel electrode 191a connected to the second gate line 121b may completely cover the second gate line 121b in the first direction. The pixel electrode 191a connected to the second gate line 121b forms a first parasitic capacitor Cgp1 along with the second gate line 121b, and simultaneously forms a second parasitic capacitor Cgp2 along with the first gate line 121a that neighbors the second gate line 121b and is farther away from the data driver 500 than the second gate line 121b. Accordingly, the data voltage of the pixel electrode 191a connected to the second gate line 121b is affected by the first kick-back voltage due to the parasitic capacitor Cgd between the drain electrode 175 and the second gate electrode 124b and due to the first parasitic capacitor Cgp21 when the second gate line 121b is supplied with the gate-off voltage Voff. The data voltage of the pixel electrode 191a is next affected by the second kick-back voltage due to the second parasitic capacitor Cgp22 when the first gate line 121a that neighbors it and is farther away from the data driver 500 is applied with the gate-off voltage Voff.

The pixel electrode 191a connected to the first gate line 121a also covers the first gate line 121a as well as the first gate electrode 124a in the first direction, thereby forming the first parasitic capacitor Cgp1 along with the first gate line 121a. The pixel electrode 191a connected to the first gate line 121a may also completely cover the first gate line 121a in the first direction. Accordingly, the data voltage of the pixel electrode 191a connected to the first gate line 121a is affected by the first kick-back voltage due to the parasitic capacitor Cgd between the drain electrode 175 and the first gate electrode 124a and due to the first parasitic capacitor Cgp11 when the first gate line 121a is applied with the gate-off voltage Voff. Also, the pixel electrode 191a connected to the first gate line 121a neighbors the underlying second gate line 121b forming a pair along with the first gate line 121a, thereby forming the second parasitic capacitor Cgp12, and is affected by the second kick-back voltage by the second parasitic capacitor Cgp12 when the second gate line 121b is applied with the gate-off voltage Voff.

As described above, the pixel electrode 191 completely or at least partially covers the first gate line 121a or the second gate line 121b (hereinafter referred to as "current gate lines") that is connected to the corresponding pixel electrode 191 in the first direction, such that the data voltage of all pixel electrodes 191 is uniformly affected by the first kick-back voltage when the current gate lines 121a and 121b are supplied with the gate-off voltage Voff, and the data voltage of all pixel electrodes 191 is affected by the second kick-back voltage when the next gate lines 121a and 121b following the current gate lines are applied with the gate-off voltage Voff. Accordingly, all pixel electrodes 191 uniformly receive the effect of the kick-back voltage two times and the deviation of the kick-back voltage may be reduced, such that any display deterioration such as the vertical line blurs may be reduced.

Also, the pixel electrode 191 covers the current gate lines 121a and 121b as well as the thin film transistor such that the size of the light blocking member 220 covering the first and second gate lines 121a and 121b may be reduced, thereby improving the aperture ratio.

Next, a thin film transistor array panel according to another exemplary embodiment of the present invention will be described with reference to FIG. 8. The same constituent elements as of the previous exemplary embodiment are indicated by the same reference numerals, and the same description is omitted.

Figure 8:
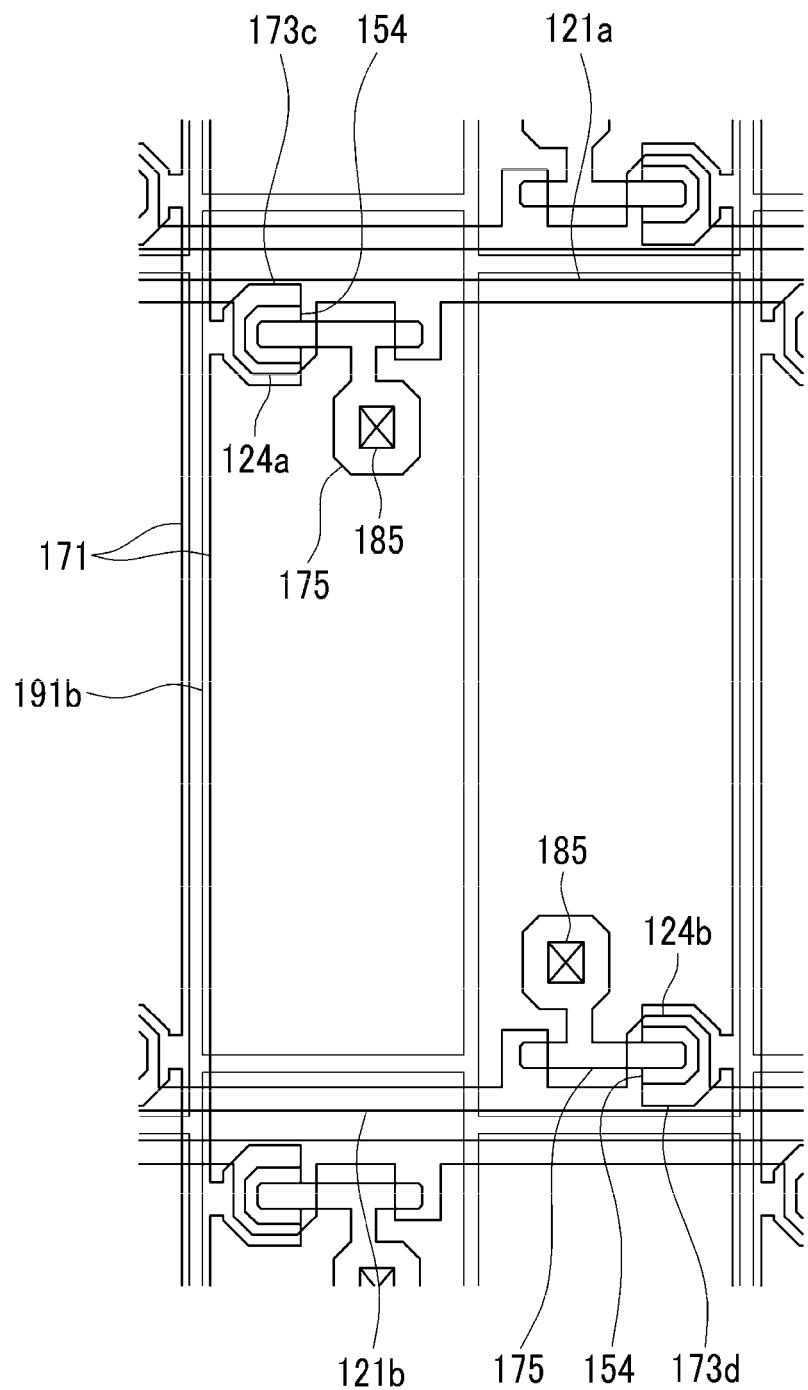

FIG. 8 is a layout view of a thin film transistor array panel according to another exemplary embodiment of the present invention. The exemplary embodiment shown in FIG. 8 has the same structure as the exemplary embodiment shown in FIG. 7, except for a pixel electrode 191b.

The pixel electrode 191b according to the present exemplary embodiment completely or at least partially covers, in the first direction or the width direction, the first gate line 121a or the second gate line 121b that are disposed before the current gate lines 121a and 121b (hereinafter, referred to as "previous gate lines"), and are previously applied with the gate-on voltage Von as well as the current gate line 121a and 121b, differently from the exemplary embodiment shown in FIG. 7. For example, in FIG. 8, the pixel electrode 191b disposed at the left side completely or at least partially covers the first gate line 121a as the current gate line and the second gate line 121b disposed thereon in the first direction, and the pixel electrode 191b disposed at the right side completely or at least partially covers the second gate line 121b as the current gate line and the first gate line 121a disposed thereon in the first direction. In this way, the pixel electrode 191b covers the previous gate lines 121a and 121b that are disposed between the data driver 500 and the current gate lines 121a and 121b while neighboring the current gate lines 121a, 121b, thereby shielding between the covered previous gate line 121a and 121b and the pixel electrode 191b (hereinafter referred to as "previous pixel electrode") that neighbor the corresponding pixel electrode 191b closer to the data driver 500 such that the data voltage of the previous pixel electrode 191b is not affected by the second kick-back voltage. Accordingly, all pixel electrodes 191b only receive the first kick-back voltage by the current gate lines 121a and 121b such that the deterioration by the vertical line blurs may be reduced.

Differently from FIG. 8, the pixel electrode 191b connected to the second gate line 121b may not completely overlap the second gate line 121b, which is the current gate line, in the first direction, and in this case, the effect of the second kick-back voltage may be reduced such that the pixel electrode 191b connected to the second gate line 121b may not overlap the first gate line 121a as the previous gate line.

The thin film transistor array panel according to the various exemplary embodiments of the present invention applied to various other display devices as well as the liquid crystal display.

According to an exemplary embodiment of the present invention, the uniform shape of the thin film transistor is formed such that the deviation of the kick-back voltage is reduced and the vertical line blurs may be reduced.

Also, according to another exemplary embodiment of the present invention, the pixel electrode covers the current gate line connected to the corresponding pixel electrode such that all pixel electrodes uniformly receive the kick-back voltage two times, or the pixel electrode covers the previous gate line such that all pixel electrodes receive the kick-back voltage one time, thereby reducing the display deterioration such as the vertical line blurs.

While this invention has been described in connection with what is presently considered to be practical exemplary embodiments, it is to be understood that the invention is not limited to the disclosed embodiments. The invention is intended to cover various modifications and equivalent arrangements included within the spirit and scope of the appended claims.

What is claimed is:

1. A thin film transistor array panel comprising:
    a first gate line and a second gate line extending in a second direction and neighboring each other;
    a first data line and a second data line extending in a first direction and neighboring each other; and
    a first pixel electrode connected to the first gate line and the first data line through a first thin film transistor,
    wherein the first pixel electrode completely covers the first gate line in the first direction and does not cover the second gate line.

2. The thin film transistor array panel of claim 1, further comprising:
    a second pixel electrode connected to the second gate line and the second data line through a second thin film transistor,
    wherein the second pixel electrode completely covers the second gate line in the first direction and does not cover the second gate line.

3. The thin film transistor array panel of claim 2, wherein the first pixel electrode and the second pixel electrode are located in a region surrounded by the first gate line, the second gate line, the first data line and the second data line.

4. The thin film transistor array panel of claim 1, wherein the first pixel electrode and a second pixel electrode are located in a region surrounded by the first gate line, the second gate line, the first data line and the second data line.

5. A thin film transistor array panel comprising:
    a first gate line and a second gate line extending in a second direction and neighboring each other;
    a first data line and a second data line extending in a first direction and neighboring each other; and
    a first pixel electrode connected to the first gate line and the first data line through a first thin film transistor,
    wherein the second gate line is applied with a gate-on voltage before the first gate line and is disposed in a previous row of the first gate line, and
    wherein the first pixel electrode completely covers the first gate line in the first direction and covers at least a portion of the second gate line in the first direction.

6. The thin film transistor array panel of claim 5, further comprising:
    a third gate line and a fourth gate line extending in the second direction and neighboring each other; and
    a second pixel electrode connected to the third gate line and the second data line through a second thin film transistor,
    wherein the fourth gate line is applied with a gate-on voltage after the third gate line and is disposed in a subsequent row of the third gate line, and
    wherein the second pixel electrode completely covers the third gate line in the first direction.

7. The thin film transistor array panel of claim 6, wherein the first pixel electrode and the second pixel electrode are located in a region surrounded by the first gate line, the third gate line, the first data line and the second data line.

8. The thin film transistor array panel of claim 7, wherein the second pixel electrode does not cover the fourth gate line.

9. The thin film transistor array panel of claim 6, wherein the second pixel electrode does not cover the fourth gate line.

10. The thin film transistor array panel of claim 5, further comprising:
    a third gate line and a fourth gate line extending in the second direction and neighboring each other; and
    a second pixel electrode connected to the third gate line and the second data line through a second thin film transistor,
    wherein the first pixel electrode and the second pixel electrode are located in a region surrounded by the first gate line, the third gate line, the first data line and the second data line.

11. The thin film transistor array panel of claim 10, wherein the second pixel electrode does not cover the fourth gate line.

12. The thin film transistor array panel of claim 5, further comprising:
    a third gate line and a fourth gate line extending in the second direction and neighboring each other; and
    a second pixel electrode connected to the third gate line and the second data line through a second thin film transistor,
    wherein the second pixel electrode does not cover the fourth gate line.

13. A thin film transistor array panel comprising:
    a plurality of pixel electrodes arranged in a matrix;
    a plurality of gate lines extending in a second direction, wherein a pair of gate lines is disposed for one pixel electrode row; and
    a plurality of data lines extending in a first direction such that one of the data lines is disposed for two pixel electrode columns,
    wherein the pair of gate lines disposed at each pixel electrode row include the first gate line and the second gate line neighboring each other, each pixel electrode row includes a first pixel electrode connected to the first gate line and a second pixel electrode connected to the second gate line,
the first pixel electrode covers the first gate line in the first direction and does not cover the second gate line, and
the second pixel electrode covers the second gate line in the first direction and does not cover the first gate line.

14. The thin film transistor array panel of claim 13, wherein the first pixel electrode of one pixel electrode row covers the second gate line of a previous pixel electrode row in the first direction.

15. The thin film transistor array panel of claim 14, wherein the first gate line connected to the first pixel electrode of one pixel electrode row is applied with a gate-on voltage later than the second gate line of the previous pixel electrode row.

16. The thin film transistor array panel of claim 13, wherein the second pixel electrode of one pixel electrode row covers the first gate line of the corresponding pixel electrode row in the first direction.

17. The thin film transistor array panel of claim 13, wherein the second pixel electrode does not cover the first gate line.

* * * * *